United States Patent [19]

Shriner

[11] 4,301,406

[45] Nov. 17, 1981

[54] MICROWAVE WARNING DEVICE

[76] Inventor: Walter Shriner, 8 S. Badalona, Hot Springs Village, Ark. 71901

[21] Appl. No.: 32,264

[22] Filed: Apr. 23, 1979

[51] Int. Cl.³ .................. G01R 21/04; G01R 19/00; G08B 21/00
[52] U.S. Cl. .................................. 324/95; 324/122; 340/600; 343/703; 361/278
[58] Field of Search .................. 324/95, 122; 340/600; 343/703, 701; 361/297, 275, 278; 250/472, 474; 63/1; 362/104

[56] References Cited

U.S. PATENT DOCUMENTS

| 1,867,944 | 7/1932 | Nijland | 324/122 |
| 1,886,489 | 11/1932 | Ludwig | 324/122 |
| 2,614,149 | 10/1952 | Steyer et al. | 361/278 |
| 3,037,165 | 5/1962 | Kerr | 361/278 |
| 3,423,679 | 1/1969 | Smith | 324/95 |
| 3,852,755 | 12/1974 | Works et al. | 343/701 |
| 3,983,717 | 10/1976 | Collica et al. | 63/1 R |
| 4,032,910 | 6/1977 | Hollway et al. | 324/95 |
| 4,177,422 | 12/1979 | Deficis et al. | 324/95 |

Primary Examiner—Ernest F. Karlsen
Attorney, Agent, or Firm—Ralph F. Staubly

[57] ABSTRACT

A device for warning a person carrying or wearing it of the presence of dangerous microwave radiation is fully powered by the radiations being detected. A very low-wattage gas-discharge lamp is energized by a broadly or a sharply tuned receiver circuit including dipole antennas or one antenna and a "grounding" casing element. The casing may be largely and uniformly transparent or have different areas gradedly light-transmissive to indicate varying radiation intensities. The casing can be made in the shape of a pocket watch, fountain pen, bracelet or finger ring, etc.

2 Claims, 8 Drawing Figures

MICROWAVE WARNING DEVICE

BACKGROUND AND OBJECTS OF THE INVENTION

While instrument-type radiation detectors are well-known, there is a need for small, simple and inexpensive microwave detectors for convenient carrying or wearing by a person, especially one who operates a microwave oven. It is the principal object of the present invention to provide such a warning device. Other objects and advantages will appear as the following detailed description proceeds.

DETAILED DESCRIPTION

Figure 1:
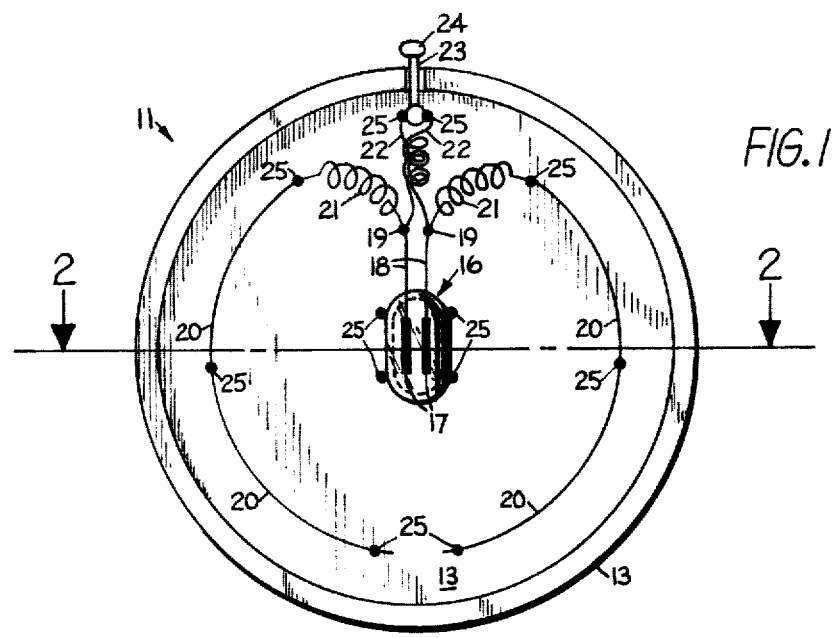
FIG. 1 is a plan view of pocket-carriable-disc embodiment of the invention with its cover plate removed.
Figure 2:
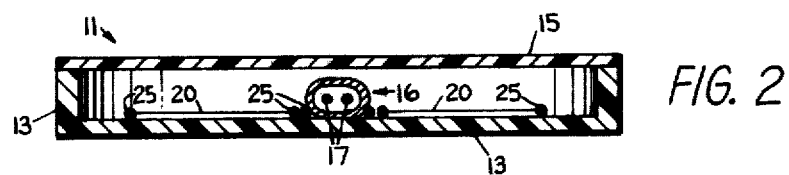
FIG. 2 is an elevational view of the FIG. 1 disclosure in section on the line 2—2 of FIG. 1.
Figure 3:
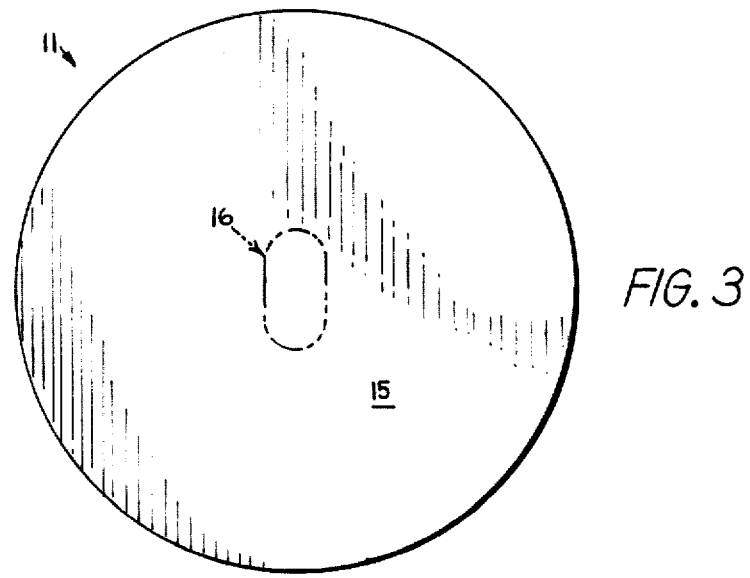
FIG. 3 is a plan view of the device of FIGS. 1 and 2 with its cover plate in place.

With reference now to FIGS. 1-3 of the drawings, the numeral 11 generally designates a pocket-watch-like embodiment of the invention. The device 11 is shown as comprising a shallow circular cup 13 and a cover disc 15, at least one of which is formed of transparent or translucent plastic material. A very low-wattage gaseous-discharge lamp 16 having electrodes 17 is centered in the cup 13 and its terminals 18 are connected (as by soldering at 19) to the ends of a pair of antenna wires 20. The wires 20 may have portions 21 thereof coiled to add tuning inductance to the circuit. A pair of short insulated wires 22 are also bridgingly electrically connected at 19 across the lamp 16 to add tuning capacitance. The free ends of the wires 22 are cemented to an insulating-material adjusting stem 23 extending outwardly through a notch in the wall of the cup 13. The stem 23 is rotatable, as by a knob 24, to vary the degree of intertwining of the wires and thereby their created capacitance. Drops 25 of plastic cement may be employed to interconnect or to anchor the parts of the device 11. Cup 13 and/or cover 15 can be divided symmetrically into radially expanding areas (not shown) of varying translucency to indicate degrees of the radiation monitored.

Figure 4:
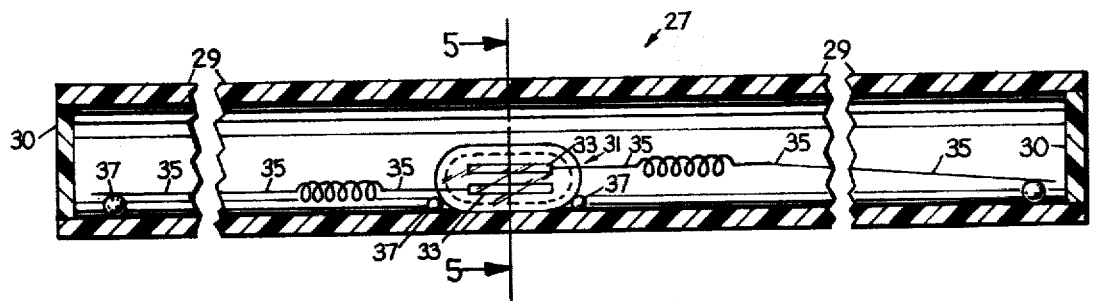
FIG. 4 is an elevational view of a fountain-pen-shaped embodiment in axial section.
Figure 5:
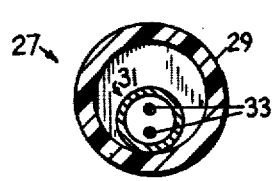
FIG. 5 is an elevational view of the FIG. 4 disclosure in section on the line 5—5 of FIG. 4.

FIGS. 4 and 5 disclose a fountain-pen-shaped species generally designated 27. The device 27 comprises a tube 29 of transparent or translucent glass or plastic material, closed by discs 30. A very low-wattage gaseous-discharge lamp 31 is located medially of the tube chamber, and its electrodes 33 are connected to antenna wires 35 extending oppositely toward the tube ends. The antenna wires 35 optionally may have portions thereof coiled at 37 to contribute tuning inductance to the antenna circuit. Drops 37 of cement can be used to anchor the various parts to the inner surface of the tube 29.

Figure 6:
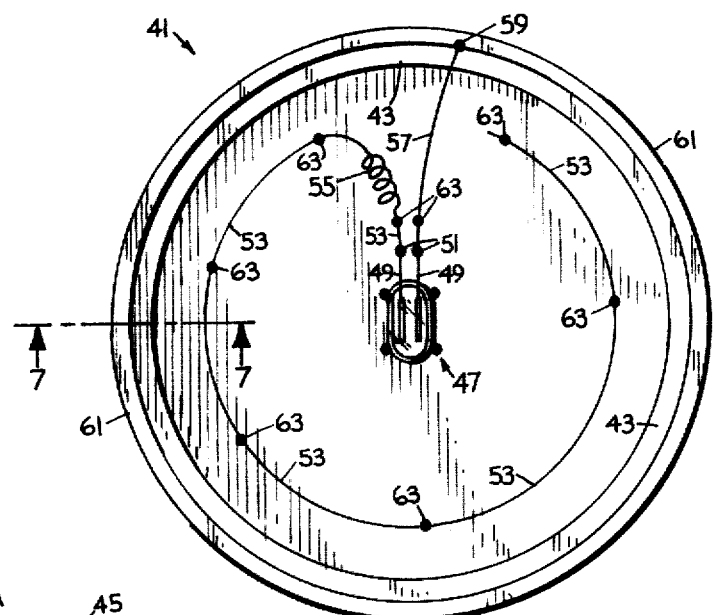
FIG. 6 is a plan view similar to FIG. 1 but showing a one-antenna species.
Figure 7:
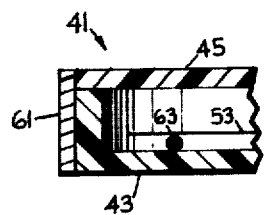
FIG. 7 is a fragmentary elevational view in section on the line 7—7 of FIG. 6.

FIGS. 6 and 7 disclose a one-antenna embodiment of the invention generally designated 41. The device 41 comprises a shallow cup 43 and a circular cover plate 45, either or both of which is/are made of transparent or translucent glass or plastic material. A very low-wattage gaseous-discharge lamp 47 is medially anchored in the cup 43, and one of its terminal wires 49 is connected (soldered) at 51 to an antenna wire 53. The antenna wire 53 optionally may be coiled at 55 to add inductance to the antenna circuit. The other lamp terminal is connected (soldered) to a lead wire 57, which is grounded at 59 to a metallic band 61 surrounding (and aiding or effecting the interconnection between) the cup 43 and its cover 45. The "grounding" effect of the band 61 would and is intended to be greatly enhanced by electric connection to the hand and thus the body of a person holding the device 41. The inner parts of the assemblage are anchored by drops 63 of cement.

Figure 8:
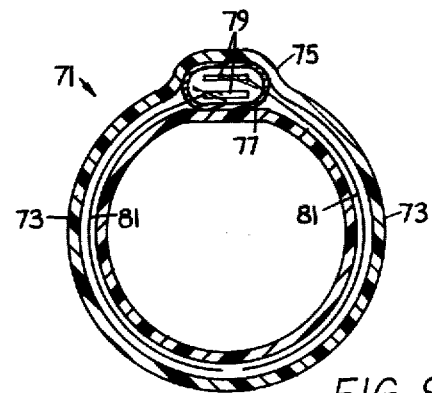
FIG. 8 is an elevational view of a ring or bracelet species in section taken on a bisecting plane perpendicular to the axis of the toroid.

FIG. 8 discloses an embodiment of the invention generally designated 71. The device 71 is in the form of a bracelet or a finger ring. It comprises a hollow toroidal body 73 made of glass or plastic material and transparent or translucent at least in its enlarged portion 75 in which its lamp 77 is housed. The electrodes 79 of the lamp 77 are connected to the oppositely extending antenna wires 81. Drops of cement (not shown) can anchor the internal elements in place in one of two identically shaped molded halves from which the toroidal body can be made.

The invention having been described, what is claimed is:

1. A device for warning a person of the momentary presence of a dangerous intensity of microwave radiation, comprising: an at-least-partly-translucent housing member of the size and shape of a pocket watch, a low-wattage gaseous-discharge light-emitting element in said housing member, antenna means carried by said housing member and operatively coupled to said light-emitting element to cause it to variably glow responsively to dangerously intense radiations detected by said device, said antenna means comprising a pair of wires constituting a dipole and connected to opposite terminals of said light-emitting element, at least one of said dipole wires having induction-coil-forming tuning convolutions in its end adjacent said light-emitting element, a pair of short flexible insulation-covered wires helically intertwined and with one end of each connected to a different terminal of said light-emitting element to constitute a variable capacitor bridging said light-emitting element, and means exterior to said casing for twisting said intertwined wires to vary the capacitance of said capacitor.

2. A warning device according to claim 1 wherein said housing member has translucent areas of differing translucence to further indicate different intensities of radiation.

* * * * *